United States Patent
Bang et al.

(10) Patent No.: US 8,240,360 B2
(45) Date of Patent: Aug. 14, 2012

(54) FIN-TYPE HEAT SINK FOR ELECTRONIC COMPONENT

(75) Inventors: Hyo-Jae Bang, Chungcheongnam-do (KR); Jung-Hyeon Kim, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 926 days.

(21) Appl. No.: 12/205,773

(22) Filed: Sep. 5, 2008

(65) Prior Publication Data

US 2009/0065175 A1    Mar. 12, 2009

(30) Foreign Application Priority Data

Sep. 6, 2007    (KR) .................. 10-2007-0090564

(51) Int. Cl.
*F28F 7/00* (2006.01)
*F28F 27/00* (2006.01)
*F28D 11/00* (2006.01)

(52) U.S. Cl. ................. 165/80.3; 165/86; 165/96

(58) Field of Classification Search ........... 165/80.2, 165/185, 96, 173, 86, 80.3, 41; 361/704; 257/722

See application file for complete search history.

(56) References Cited

U.S. PATENT DOCUMENTS

| | | | |
|---|---|---|---|
| 6,201,697 B1 * | 3/2001 | McCullough | 361/704 |
| 6,341,651 B1 * | 1/2002 | Ohta | 165/185 |
| 6,650,215 B1 * | 11/2003 | Gundale | 336/61 |
| 6,839,232 B2 * | 1/2005 | Elo et al. | 361/690 |
| 7,085,134 B2 * | 8/2006 | Foster et al. | 361/695 |
| 7,187,552 B1 | 3/2007 | Stewart et al. | |
| 2003/0192672 A1 * | 10/2003 | Lee et al. | 165/80.3 |
| 2005/0193559 A1 * | 9/2005 | Miyahara | 29/890.03 |

FOREIGN PATENT DOCUMENTS

| | | |
|---|---|---|
| JP | 6-21281 | 1/1994 |
| KR | 10-2007-0000716 | 1/2007 |

* cited by examiner

*Primary Examiner* — Allen Flanigan
*Assistant Examiner* — Jason Thompson
(74) *Attorney, Agent, or Firm* — Muir Patent Consulting, PLLC

(57) ABSTRACT

One embodiment exemplarily described herein can be generally characterized as a heat sink for an electronic component. The heat sink may include a main body thermally contactable to an electronic component; at least one fin thermally contacted with the main body; and a confining member. The at least one fin and the confining member may be cooperatively engaged such that the at least one fin is moveable between a first position relative to a longitudinal axis of the main body and a second position relative to the longitudinal axis of the relative to the main body.

18 Claims, 10 Drawing Sheets

FIN-TYPE HEAT SINK FOR ELECTRONIC COMPONENT

CROSS-REFERENCE TO RELATED PATENT APPLICATION

This application claims the benefit of Korean Patent Application No. 10-2007-0090564, filed on Sep. 6, 2007, the disclosure of which is incorporated herein in its entirety by reference.

BACKGROUND

Embodiments of the present invention generally relate to a fin-type heat sink for an electronic component. More particularly, embodiments of the present invention relate to a fin-type heat sink having fins that are moveable to facilitate the attachment/detachment of an electronic component with respect to a socket assembly and to maximize heat dissipation efficiency during use of the electronic component.

SUMMARY

Embodiments of the present invention are capable of providing a fin-type heat sink for an electronic component in which fin can be laid to facilitate the assembly of a module during attachment/detachment of a socket and erected to maximize heat dissipation efficiency during use of the electronic component.

One embodiment exemplarily described herein can be generally characterized as a heat sink for an electronic component. The heat sink may include a main body thermally contactable to an electronic component; at least one fin thermally contacted with the main body; and a confining member. The at least one fin and the confining member may be cooperatively engaged such that the at least one fin is moveable between a first position relative to a longitudinal axis of the main body and a second position relative to the longitudinal axis of the relative to the main body.

BRIEF DESCRIPTION OF THE DRAWINGS

The accompanying figures are included to provide a further understanding of the exemplary embodiments of the present invention, and are incorporated in and constitute a part of this specification. In the figures.

DETAILED DESCRIPTION OF THE EMBODIMENTS

Figure 1:
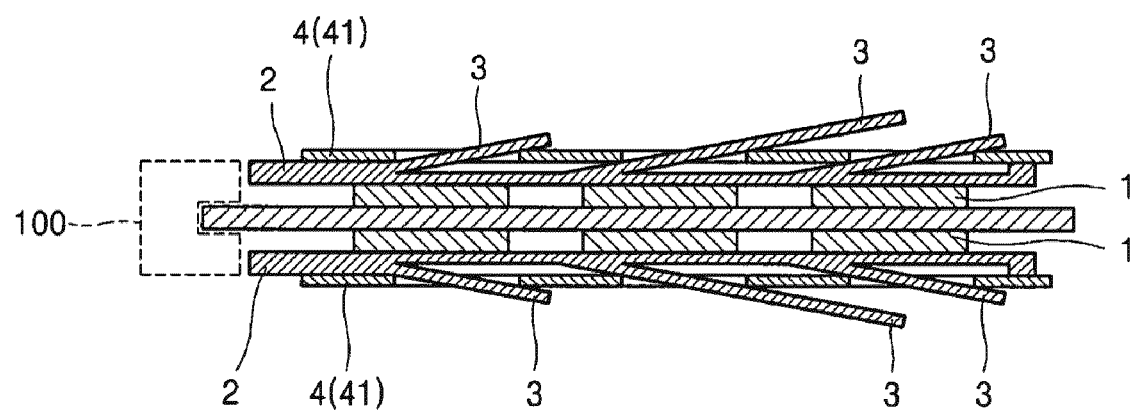
FIG. 1 is a cross-sectional view of a fin-type heat sink for an electronic component according to an exemplary embodiment of the present invention, in which fins are laid.

Exemplary embodiments of the present invention will be described more fully hereinafter with reference to the accompanying drawings. These embodiments may, however, be realized in many different forms and should not be construed as limited to the embodiments set forth herein. Rather, these embodiments are provided so that this disclosure will be thorough and complete, and will fully convey the scope of the invention to those skilled in the art. In the drawings, the device size and relative sizes of layers and regions may be exaggerated for clarity. Like numbers refer to like elements throughout.

Figure 2:
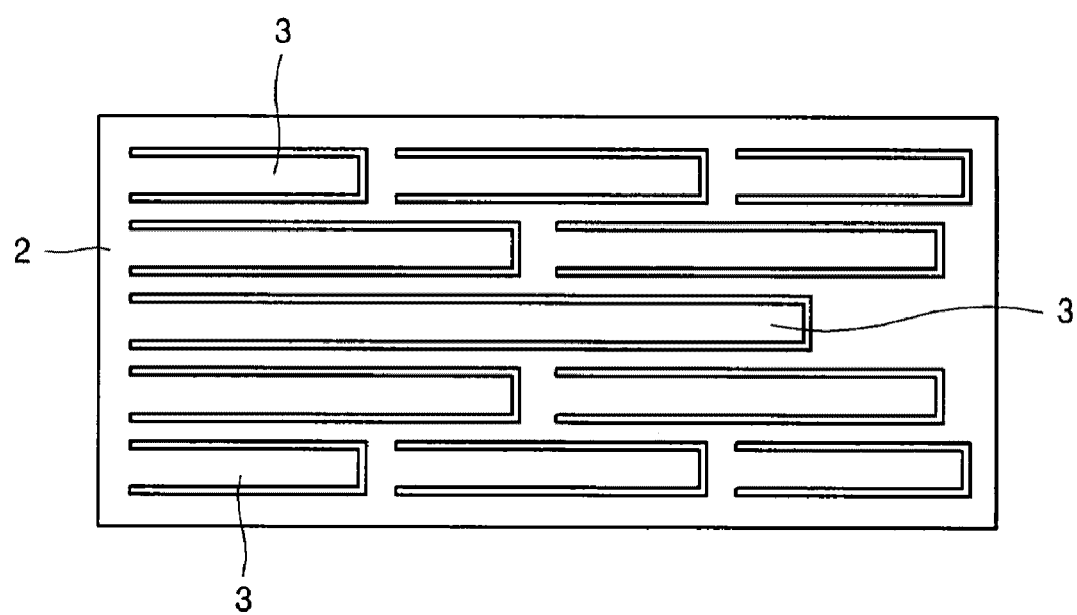
FIG. 2 is a plan view of the fin shown in FIG. 1.
Figure 3:
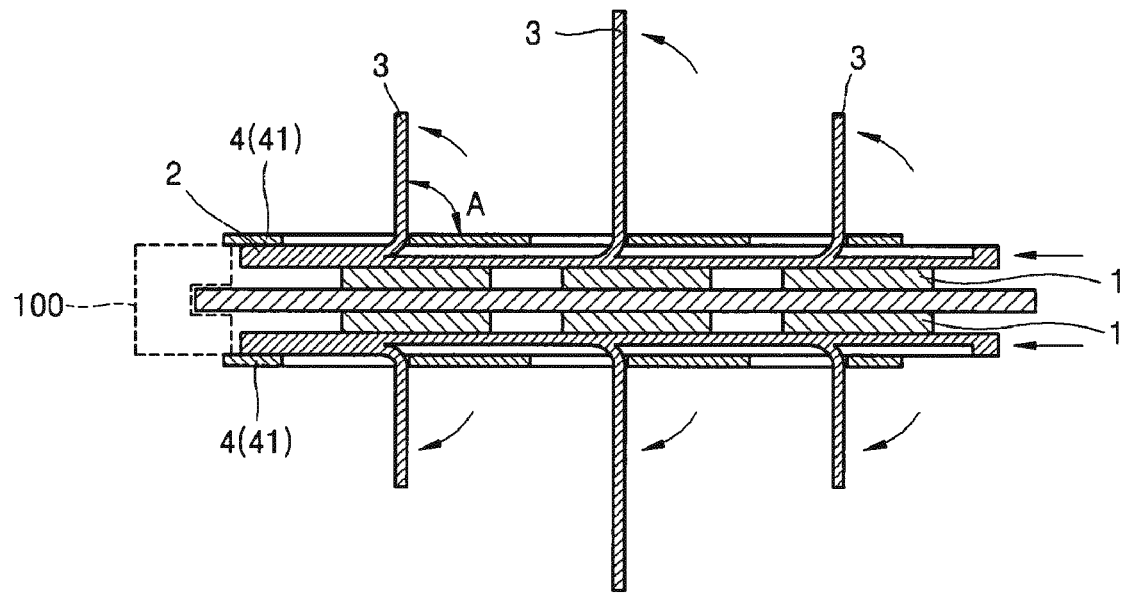
FIG. 3 is a cross-sectional view of the fin-type heat sink shown in FIG. 1, in which fins are erected.
Figure 4:
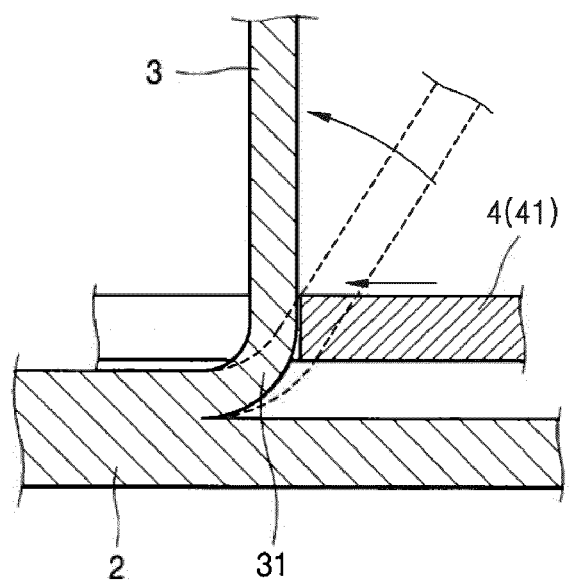
FIG. 4 is a magnified cross-sectional view of a bent portion of a fin shown in FIG. 3.

FIG. 1 is a cross-sectional view of a fin-type heat sink for an electronic component according to an exemplary embodiment of the present invention, in which fins are laid. FIG. 2 is a plan view of the fin shown in FIG. 1. FIG. 3 is a cross-sectional view of the fin-type heat sink shown in FIG. 1, in which fins are erected. FIG. 4 is a magnified cross-sectional view of a bent portion of a fin shown in FIG. 3.

Referring generally to FIGS. 1 through 4, a fin-type heat sink for an electronic component may include a main body 2, fins 3, and a confining member 4. In the illustrated embodiment, the confining member may be a pressure support 41.

Referring to FIG. 1, the main body 2 may be thermally contacted by an electronic component 1. Referring to FIGS. 1 and 2, the fins 3 are thermally contacted by the main body 2 so that the fins 3 receive heat generated by the electronic component 1 through the main body 2. The heat received by the fins 3 is then dissipated into the surrounding air. A plurality of fins 3 may be formed on one surface of the main body 2.

As shown in FIG. 1, the fins 3 may be laid along a longitudinal axis of the main body 2 when the electronic component 1 is to be inserted into a socket 100. Thus, the fins 3 may be arranged at a first position relative to the longitudinal axis of the main body 2 when the electronic component 1 is outside a socket 100. As shown in FIG. 3, the fins 3 may be erected to a predetermined angle "A" relative to the longitudinal axis of the main body 2 after the component 1 is inserted into the socket 100. The, the predetermined angle A may be any substantially non-zero angle. In one embodiment, the predetermined angle A may be about 90° (as shown in FIG. 4). Thus, the fins 3 may be arranged at a second position relative to the longitudinal axis of the main body 2 when the electronic component 1 is inserted into the socket 100.

Referring to FIGS. 3 and 4, the confining member 4 allows the fins 3 to be selectively moved from the first position to the second position. In the illustrated embodiment, the confining member 4 may be provided as a pressure support 41 configured to apply pressure to a neck portion of the fins 3. When sufficient pressure is applied to a fin 3, the neck portion of the fins 3 becomes bent at the predetermined angle A relative to the longitudinal axis of the main body 2, thereby forming a bent portion 31. In one embodiment, the pressure applied to a fin 3 may be greater than the yield stress of the fin 3 so as to bend the neck portion of the fin 3. It will be appreciated that the predetermined angle A may vary in accordance with the pressure applied by the pressure support 41.

In the embodiment shown in FIG. 3, the pressure support 41 is configured to apply pressure to the plurality of fins 3 at substantially the same time. As a result, an operator only has to apply pressure to the pressure support 41 once so as to bend the fins 3 at the predetermined angle "A." Therefore, as shown in FIG. 1, before the electronic component 1 is inserted into the socket 100, the fins 3 may be laid along a longitudinal axis of the main body (i.e., arranged at the first position) to facilitate the assembly of the electronic component 1 in a narrow space. After the electronic component 1 is inserted into the socket 100 as shown in FIG. 3, the operator may apply pressure to the pressure support 41 to erect the fins 3 (i.e., move the fins 3 to the second position). Thus, heat dissipation efficiency can be maximized to satisfy heat dissipation specifications needed for products.

FIGS. 5 through 18 illustrate some other exemplary embodiments of a fin-type heat sink for an electronic component.

Figure 5:
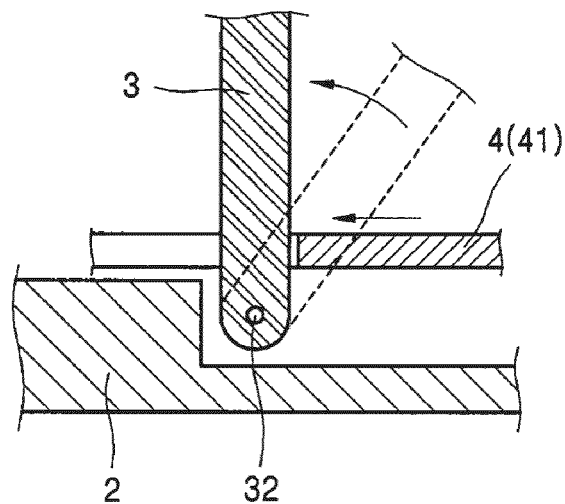
FIG. 5 is a magnified cross-sectional view of a fin-type heat sink according to another exemplary embodiment of the present invention.

Referring to FIG. 5, a fin-type heat sink may include a hinge portion 32, wherein the fin 3 is joined to the main body 2 by the hinge portion 32. A plurality of fins 3 may rotate about the hinge portion 32 due to pressure applied by the pressure support 41 so as to be moved from the first position to a second position.

Figure 6:
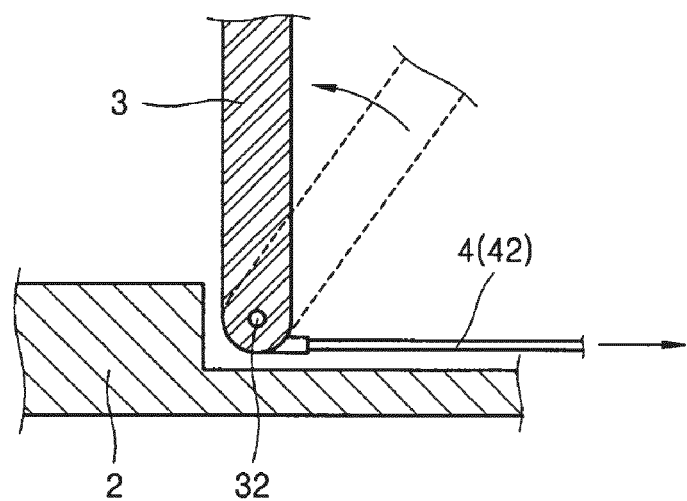
FIG. 6 is a magnified cross-sectional view of a fin-type heat sink according to yet another exemplary embodiment of the present invention.

Referring to FIG. 6, a fin-type heat sink may include a confining member 4 provided as a wire 42. The wire 42 is connected to one side of a fin 3 such that, when an operator pulls the wire 42, the fin 3 rotates about the hinge portion 32 and is moved from the first position to the second position.

Figure 7:
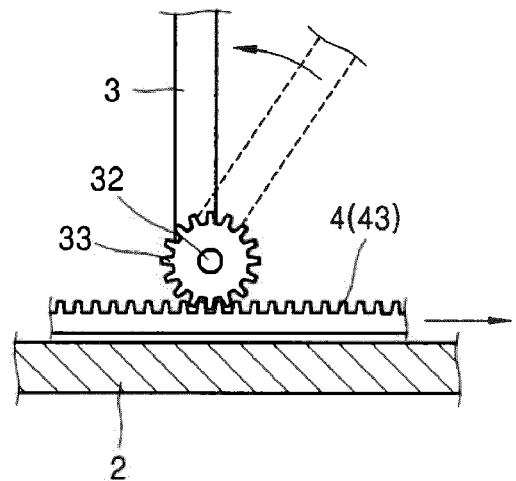
FIG. 7 is a magnified cross-sectional view of a fin-type heat sink according to still another exemplary embodiment of the present invention.

Referring to FIG. 7, a fin-type heat sink may include a rotation member 33 connected to a fin 3 and a confining member 4 provided as an engaging support 43. The rotation member 33 is rotatable about a hinge portion 32. The engaging support 43 is engaged with the rotation member 33 such that, when an operator pulls the engaging support 43, the fin 3 rotates about the hinge portion 32 due to the rotation of the rotation member 33 and is moved from the first position to the second position.

Figure 8:
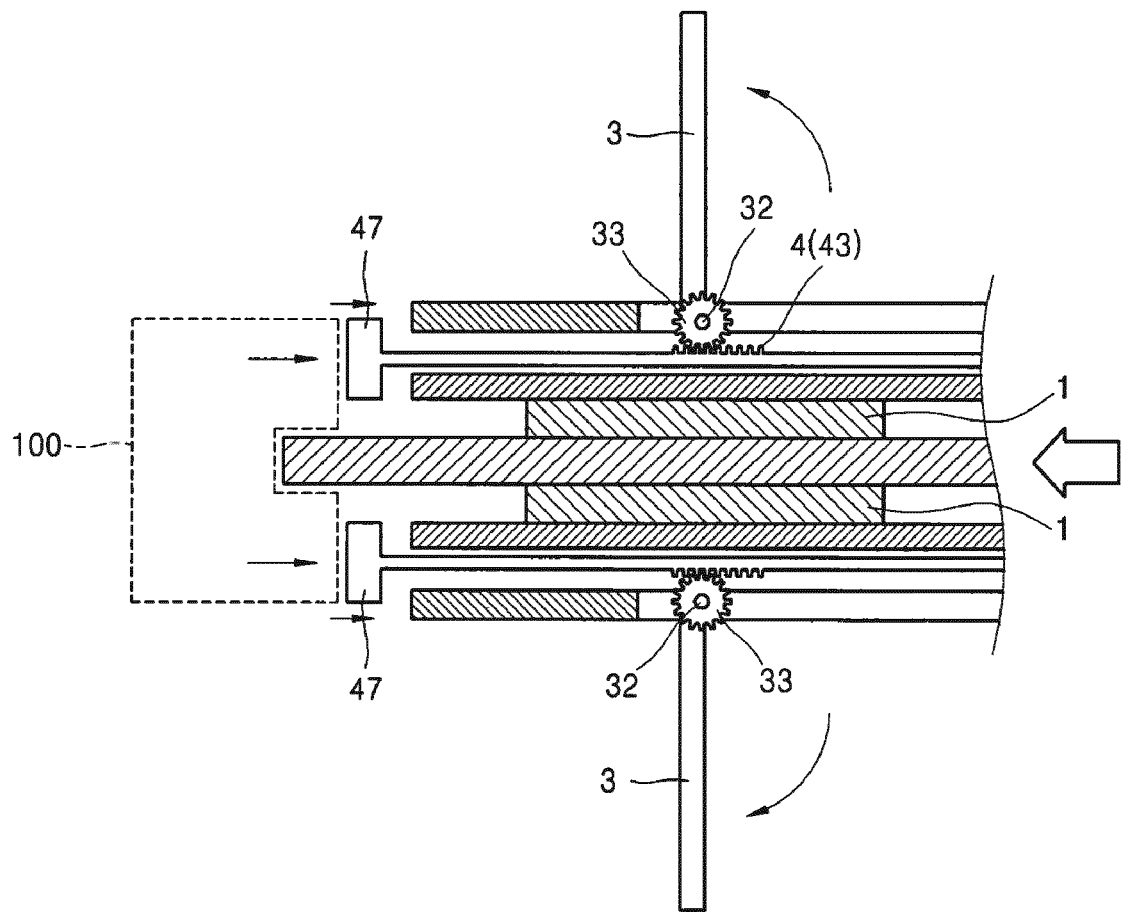
FIG. 8 is a cross-sectional view of a fin-type heat sink for an electronic component inserted into a socket according to an exemplary embodiment of the present invention.

Referring to FIG. 8, a fin-type heat sink may include an operating switch 47 coupled to the engaging support 43 and configured to contact the socket 100 when the electronic component 1 is inserted into the socket 100. When the electronic component 1 is inserted into the socket 100, the operating switch 47 contacts the socket 100 and the engaging support 43 is moved backward such that the fin 3 rotates about the hinge portion 32 due to the rotation of the rotation member 33. As a result, the fin 3 is moved from the first position to the second position. Thus, a user may insert the electronic component 1 into the socket 100 using a one-touch method to operate the operating switch 47 to move the engaging support 43 backward so that the fin 3 can rotate about the hinge portion 32 from the first position to the second position.

Figure 9:
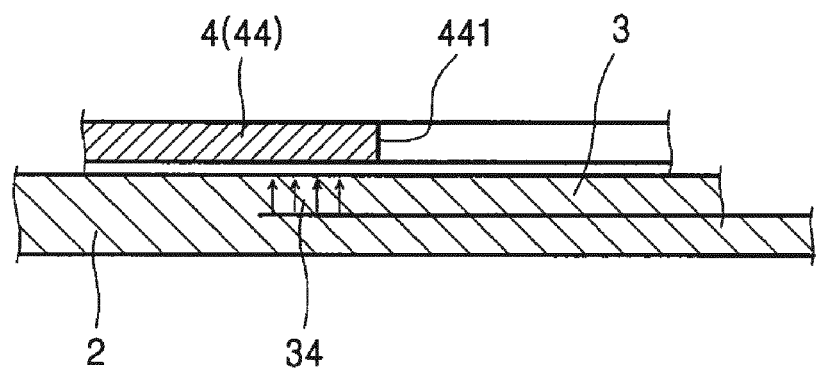
FIG. 9 is a magnified cross-sectional view of a fin-type heat sink according to another exemplary embodiment of the present invention, in which the fin is laid.
Figure 10:
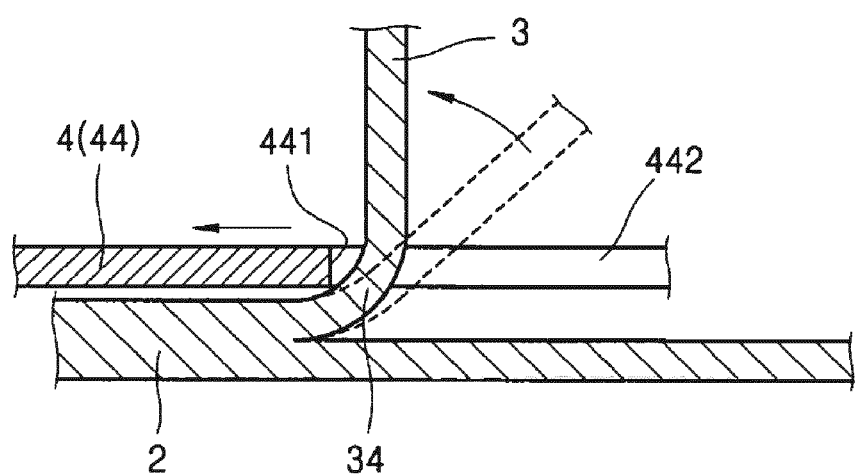
FIG. 10 is a magnified cross-sectional view of the fin-type heat sink shown in FIG. 9, in which the fin is erected.

Referring to FIG. 9, a fin-type heat sink may include a fin 3 with an elastic portion 34. In one embodiment, the elastic portion 34 may be provided as a neck portion with an elastic characteristic which produces a restoring force in a direction in which the fin 3 is moved from the first position to the second position. The confining member 4 may be provided as a confining support 44 configured to apply pressure to the elastic portion 34 of the fin 3 and temporarily confine the elastic portion 34. Accordingly, the confining support 44 may be configured to apply a pressure to the elastic portion 34 of the fin 3 sufficient to arrange the fin 3 at the first position. In the illustrated embodiment, the confining support 44 may include a confining plate 442 having a through hole 441 (only one sidewall of which is shown) to allow the fin 3 to pass therethrough. Thus, the through hole 441 is configured to receive at least a portion of the fin 3. Accordingly, before the electronic component 1 is inserted into the socket 100, the confining plate 442 temporarily confines the fin 3 such that the fin 3 is laid along a longitudinal axis of the main body 2, thereby facilitating insertion of the electronic component 1 into the socket 100 in a narrow space. Thus, before the electronic component 1 is inserted into the socket 100, the confining plate 442 temporarily confines the fin 3 such that the fin 3 is arranged at the first position. Referring to FIG. 10, after the electronic component 1 described with respect to FIG. 9 is inserted into the socket 100 in the narrow space, the operator may move the confining plate 442 so that the fin 3 is erected by itself from the first position to the second position due to the elastic portion 34, thereby maximizing heat dissipation efficiency.

Figure 11:
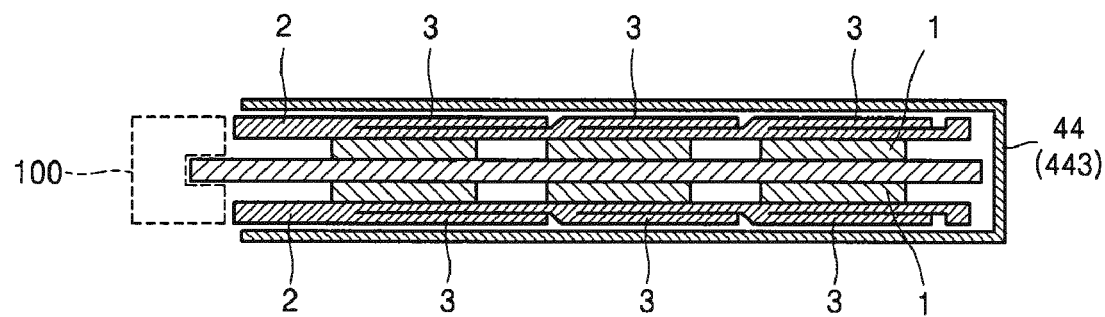
FIG. 11 is a cross-sectional view of a fin-type heat sink according to an exemplary embodiment of the present invention, wherein the fins are laid.
Figure 12:
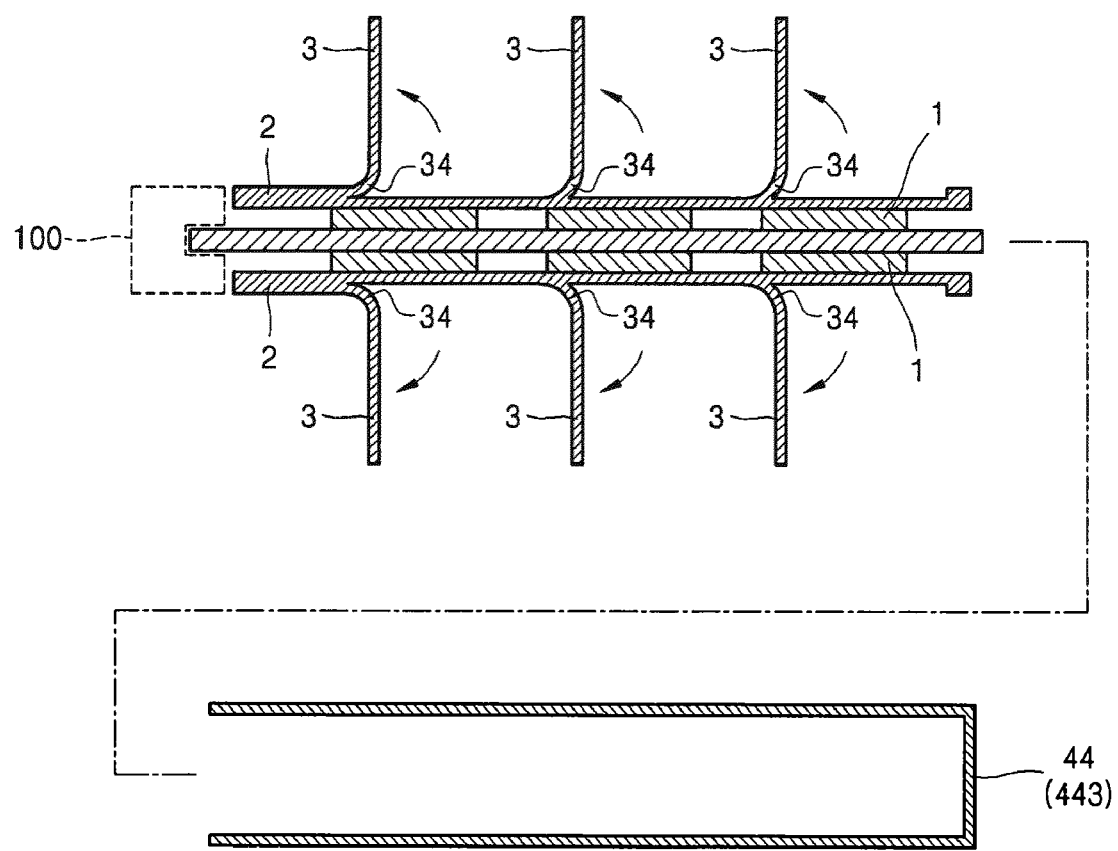
FIG. 12 is a cross-sectional view of the fin-type heat sink shown in FIG. 11, wherein the fins are erected.

Referring to FIG. 11, a fin-type heat sink may be provided as discussed above with respect to FIGS. 9 and 10, but the confining member 4 may be provided as a confining case 443 instead of the confining plate 442. The confining case 443 may cover the fin 3 and temporarily confine the fin 3 to lay the fin 3 along a longitudinal axis of the main body 2, thereby facilitating insertion of the electronic component 1 into the socket 100 in a narrow space. Thus, the confining case 443 may be configured to receive the fin 3 arranged at the first position. As shown in FIG. 12, after the electronic component 1 is inserted into a socket 100, an operator may remove the confining case 443 from the fin-type heat sink so that the fin 3 is erected by itself from the first position to the second position due to an elastic portion 34 (i.e., a neck portion with an elastic characteristic), thereby maximizing heat dissipation efficiency.

Figure 13:
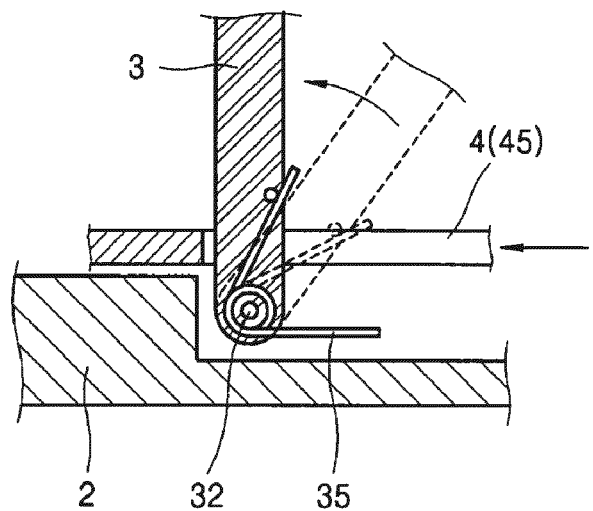
FIG. 13 is a magnified cross-sectional view of another exemplary embodiment of a fin-type heat sink.
Figure 14:
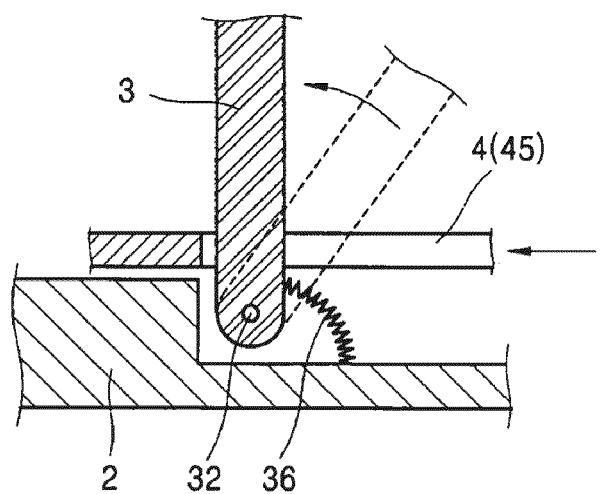
FIG. 14 is a magnified cross-sectional view of yet another exemplary embodiment of a fin-type heat sink.

Referring to FIGS. 13 and 14, a fin-type heat sink may include an elastic spring configured to produce a restoring force capable of rotating the fin 3 from the first position to the second position about the hinge portion 32. The elastic spring may be provided as a coil-type spring 35 (as shown in FIG. 13) or as a twist-type spring 36 (as shown in FIG. 14). It will be appreciated, however, that the elastic spring may be provided as any suitable type of spring. When the fin 3 includes the elastic spring, the confining member 4 may be provided as a confining support 45 configured to temporarily counteract the restoring force of the elastic spring on the fin 3.

Figure 15:
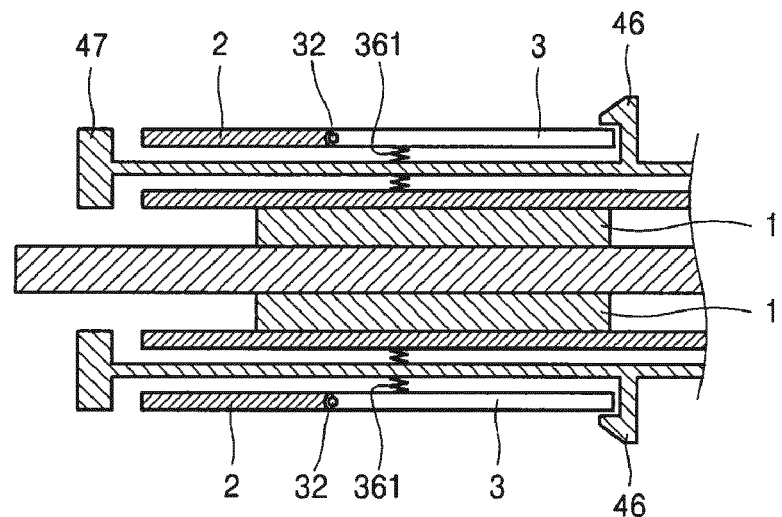
FIG. 15 is a cross-sectional view of a fin-type heat sink according to an exemplary embodiment of the present invention, in which the fins are laid.
Figure 16:
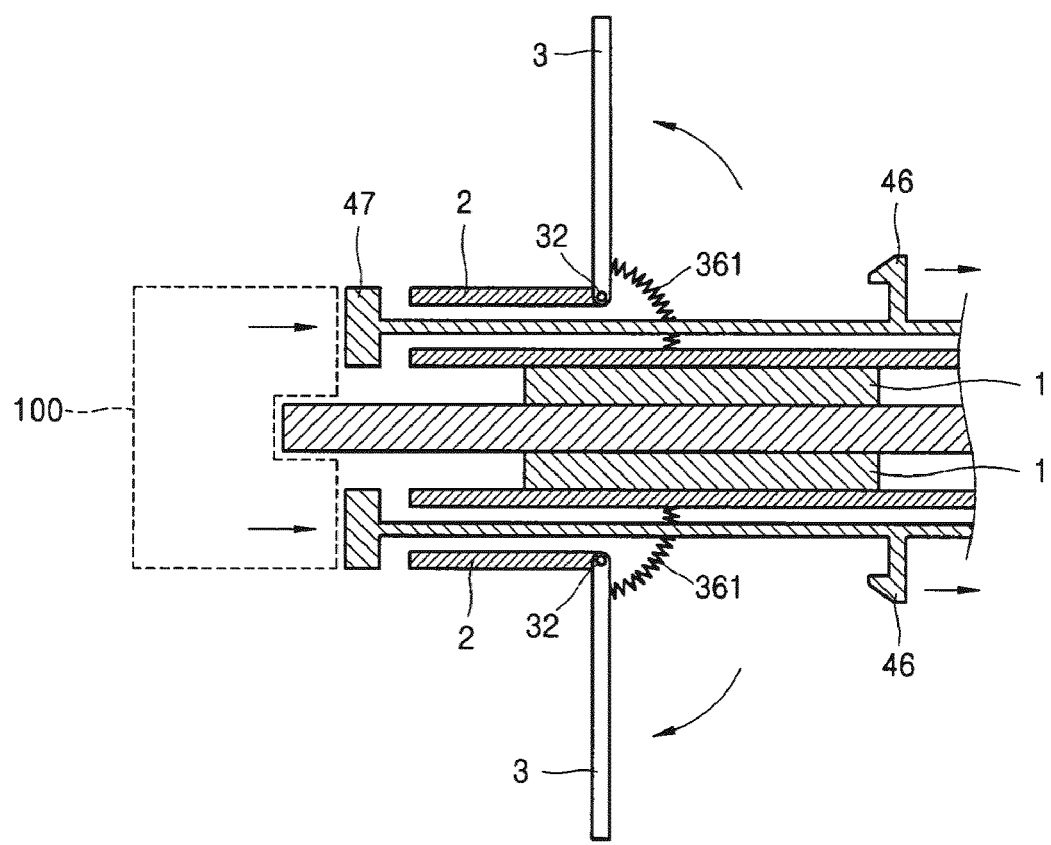
FIG. 16 is a cross-sectional view of the fin-type heat sink shown in FIG. 15, in which the fins are erected.

Referring to FIG. 15, a fin-type heat sink may include a confining member 4 provided as a fixing unit 46 and an operating switch 47. The fixing unit 46 may temporarily fix a laid fin 3 along a longitudinal axis of a main body 2. The operating switch 47 may selectively control the fixing unit 46 and unfix the temporarily fixed fin 3, so as to erect the fin 3 from the first position to the second position. In the illustrated embodiment, the operating switch 47 may be coupled to the fixing unit 46 and be configured to contact the socket 100 when the electronic component 1 is inserted into the socket 100. When the electronic component 1 is inserted into the socket 100, the operating switch 47 contacts the socket 100 and the fixing unit 46 is disengaged from the fin 3, allowing the fin 3 to rotate about the hinge portion 32 due to the restoring force of the elastic spring 361. As a result, the fin 3 is moved from the first position to the second position. Therefore, before the electronic component 1 is inserted into the socket 100 as shown in FIG. 15, the fin 3 is laid along the longitudinal axis of the main body 2 and temporarily fixed by the fixing unit 46. However, as shown in FIG. 16, an operator has only to insert the electronic component 1 into the socket 100 using a one-touch method to disengage the fixing unit 46 due to the operating switch 47, so that the fin 3 can rotate by itself about a hinge portion 32 due to an elastic spring 361 and be erected from the first position to the second position.

Figure 17:
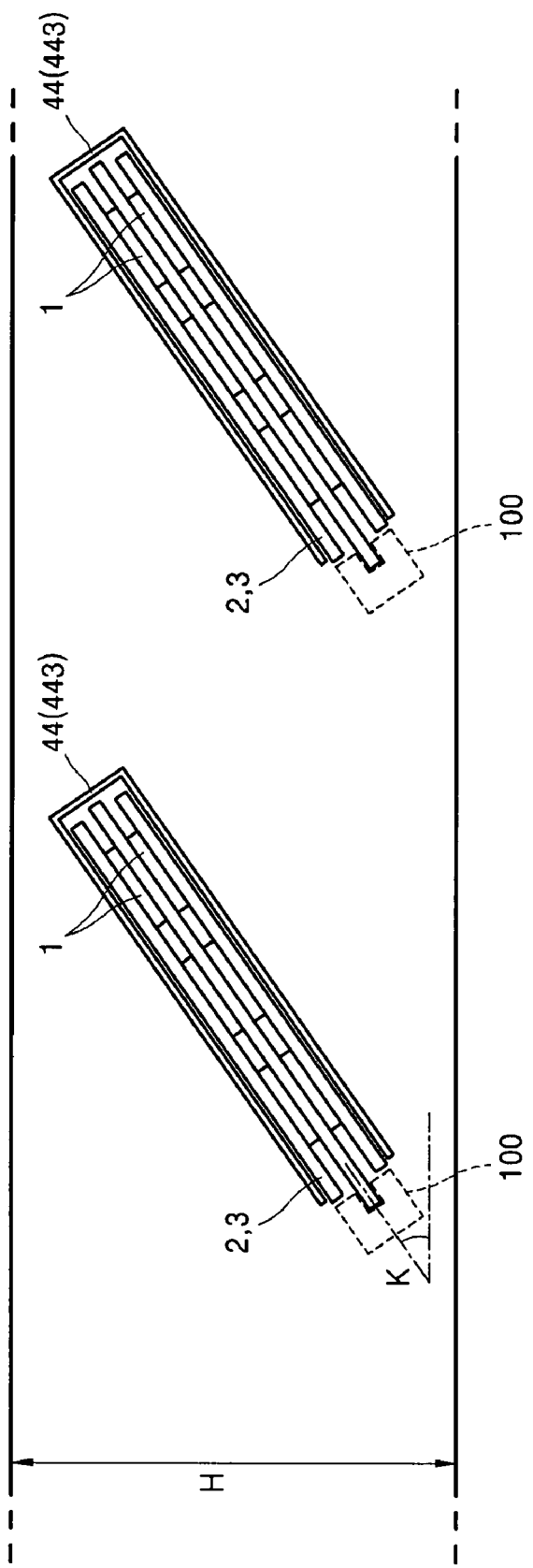
FIG. 17 is a cross-sectional view of a fin-type heat sink for an electronic component according to an exemplary embodiment of the present invention, in which fins are laid.
Figure 18:
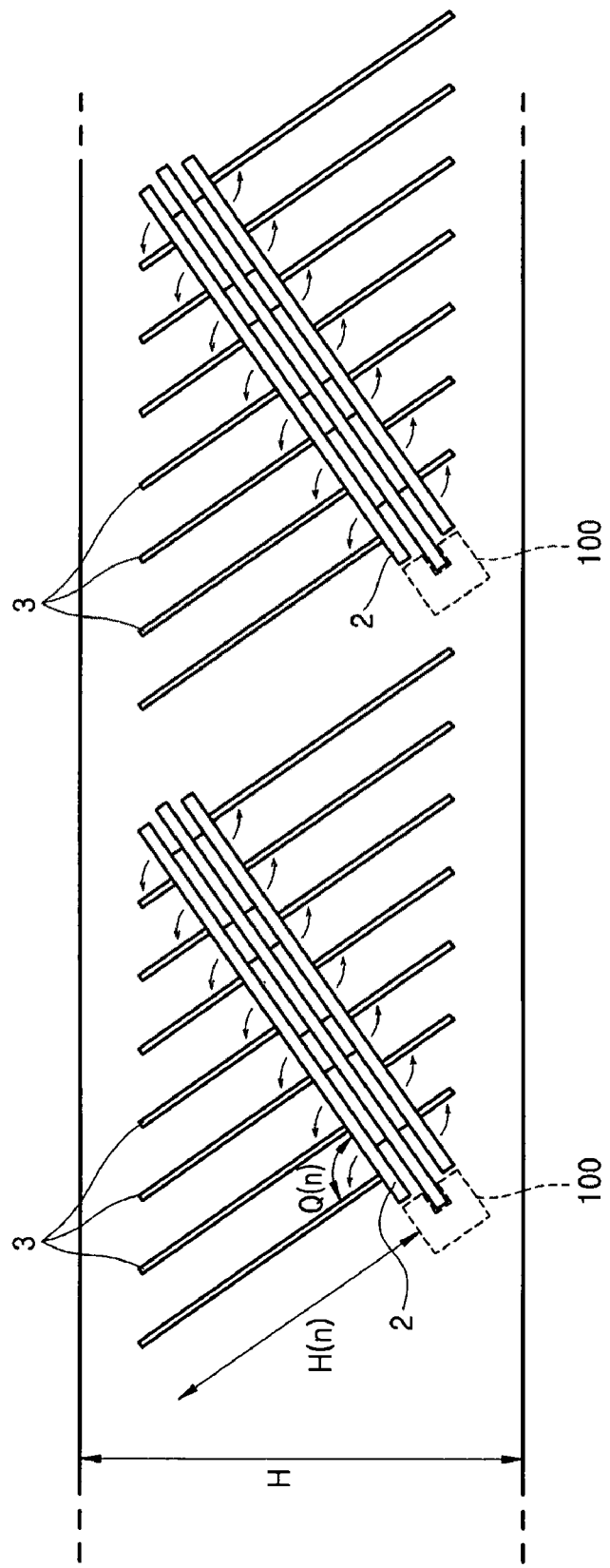
FIG. 18 is a cross-sectional view of the fin-type heat sink shown in FIG. 17, in which the fins are erected.

Referring to FIGS. 17 and 18, a length "H(n)" and an erection angle "Q(n)" of each fin 3 of a fin-type heat sink may be determined by a dimension (e.g., a height "H") of a confined space into which the fin-type heat sink is arranged and an angle "K" at which the heat sink is installed. Thus, the length H(n) of each of the fins 3 may gradually decrease or increase along the length of the fin-type heat sink so as to maximize the surface area of each of the fins 3 and minimize the amount of empty space, thereby maximizing heat dissipation efficiency of the fin-type heat sink. In the illustrated embodiment, the confining support 44 is provided as the confining case 443 that temporarily confines the fin 3 to the first position, thereby facilitating insertion of the electronic component 1 into the socket 100 within the confined space having a dimension (e.g., height H). As shown in FIG. 18, after the electronic component 1 is inserted into the socket 100, an operator may remove the confining case 443 from the fin-type heat sink to erect the fin 3 from the first position to the second position.

According to the embodiments described above, electronic components can be efficiently assembled by laying fins along the longitudinal axis of a main body, so that modules can be assembled at various angles in limited spaces. Also, the fins can be erected from the first position to the second position in optimal configurations so as to maximize heat dissipation efficiency after assembly of the electronic components. Thus, heat dissipation specifications needed for products, such as computer main frames, can be satisfied, and the volumes of the products can be minimized.

While embodiments of the present invention have been particularly shown and described above, it will be understood by one of ordinary skill in the art that various changes in form and details may be made therein without departing from the spirit and scope of the present invention as defined by the following claims.

What is claimed is:

1. A heat sink for an electronic component, the heat sink comprising:
   a main body thermally contactable to an electronic component;
   a plurality of fins including at least a first fin thermally contacting the main body and a second fin thermally contacting the main body; and
   a pressure-applying member including a plurality of slots, wherein a first slot has an edge that engages the first fin, and a second slot has an edge that engages the second fin, wherein at least the first fin and the second fin are cooperatively engaged with the pressure-applying member such that each of the first fin and the second fin is moveable between a first position relative to a longitudinal axis of the main body and a second position relative to the longitudinal axis of the main body, and the pressure-applying member is slidingly engaged with at least the first fin and second fin to allow each of the first fin and second fin to be moved from the first position to the second position.

2. The heat sink of claim 1, wherein an angle defined between the longitudinal axis of the main body and the first fin arranged at the second position is greater than an angle defined between the longitudinal axis of the main body and the first fin arranged at the first position.

3. The heat sink of claim 1, wherein the first fin comprises a neck portion, wherein the first fin is connected to the main body by the neck portion.

4. The heat sink of claim 1, wherein the first fin comprises a neck portion connected to the main body and wherein the pressure-applying member is a pressure support configured to apply pressure to the neck portion of the first fin.

5. The heat sink of claim 1, wherein the electronic component is connected to a substrate insertable into a socket.

6. The heat sink of claim 1, wherein lengths of the plurality of fins changes along a length of the main body.

7. The heat sink of claim 6, wherein the longest length fin of the plurality of fins is disposed at a first end of the main body and the shortest length fin of the plurality of fins is disposed at a second end opposite to the first end of the main body.

8. The heat sink of claim 1, wherein the plurality of slots are a plurality of slots of a pressure support, wherein each of the plurality of fins and the plurality of slots are cooperatively engaged such that the plurality of fins are moveable between the first position relative to a longitudinal axis of the main body and the second position relative to the longitudinal axis of the main body, when pressure is exerted on the plurality of fins by the pressure support.

9. The heat sink of claim 1, wherein the pressure-applying member is disposed above the main body such that an empty area is located between the pressure-applying member and the main body.

10. A heat sink for an electronic component, the heat sink comprising:
    a main body thermally contactable to an electronic component;
    a plurality of fins including at least a first fin thermally contacting the main body and a second fin thermally contracting the main body; and
    a fin-moving member including a plurality of slots, wherein a first slot has an edge that engages the first fin, and a second slot has an edge that engages the second fin, wherein each of the first fin and the second fin are cooperatively engaged with the fin-moving member such that each of the first fin and the second fin is moveable between a first position relative to a longitudinal axis of the main body and a second position relative to the longitudinal axis of the main body, and the fin-moving member is configured to be engaged and disengaged with the first and second fins and to cause the first and second fins to be moved from the first position to the second position.

11. The heat sink of claim 10, wherein each of the plurality of fins are cooperatively engaged with respective slots of the fin-moving member such that the plurality of fins are moveable between the first position relative to a longitudinal axis of the main body and the second position relative to the longitudinal axis of the main body, when pressure is exerted on the plurality of fins by the fin-moving member.

12. The heat sink of claim 10, wherein the fin-moving member is disposed above the main body such that an empty area is located between the fin-moving member and the main body.

13. A heat sink for an electronic component, the heat sink comprising:
- a main body thermally contactable to an electronic component;
- a plurality of fins thermally contacting the main body; and
- a pressure support disposed above the main body and including a plurality of slots, each slot having an edge that engages a fin of the plurality of fins,
- wherein the plurality of fins and the pressure support including the plurality of slots are cooperatively engaged such that each slot exerts pressure on a respective fin to cause the fin to remain in a second position relative to a longitudinal axis of the main body different from a first position of the fin prior to the pressure being exerted.

14. The heat sink of claim 13, wherein an angle defined between the longitudinal axis of the main body and at least a first fin of the plurality of fins arranged at the second position is greater than an angle defined between the longitudinal axis of the main body and the first fin arranged at the first position.

15. The heat sink of claim 13, wherein the pressure support is slidably engaged with the main body to permit each of the plurality of fins to be moved from the first position to the second position.

16. The heat sink of claim 13, wherein the pressure support is disposed above the main body such that an empty area is located between the pressure support and the main body.

17. The heat sink of claim 1, wherein the second position for the first fin has a first angle relative to the longitudinal axis of the main body, and the second position for the second fin has a second angle relative to the longitudinal axis of the main body.

18. The heat sink of claim 17, wherein the first angle is the same as the second angle.

\* \* \* \* \*